United States Patent
Birk

(10) Patent No.: US 7,952,419 B1
(45) Date of Patent: May 31, 2011

(54) BOOTSTRAPPED SWITCH CIRCUIT

(75) Inventor: Christian Steffen Birk, Innishannon (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/619,068

(22) Filed: Nov. 16, 2009

(51) Int. Cl.
*H03K 17/16* (2006.01)

(52) U.S. Cl. ......... 327/427; 327/434; 327/390; 327/589

(58) Field of Classification Search .................. 327/427, 327/434, 390, 589
See application file for complete search history.

(56) References Cited

U.S. PATENT DOCUMENTS

| | | | |
|---|---|---|---|
| 4,395,643 A * | 7/1983 | Lehmann ...................... 327/308 |
| 5,406,222 A | 4/1995 | Brokaw | |
| 5,500,612 A | 3/1996 | Sauer | |
| 5,717,356 A * | 2/1998 | Kohama .......................... 327/427 |
| 6,069,503 A * | 5/2000 | Doyle ............................ 327/103 |
| 6,496,072 B2 * | 12/2002 | Cho et al. ...................... 330/284 |
| 6,873,200 B2 * | 3/2005 | Evers et al. .................... 327/365 |
| 6,943,786 B1 | 9/2005 | Birk et al. | |
| 7,183,814 B2 | 2/2007 | Kudo | |
| 7,408,396 B2 * | 8/2008 | El-Khoury et al. ........... 327/318 |
| 2006/0202742 A1 | 9/2006 | Aksin et al. | |

OTHER PUBLICATIONS

J. Steensgard, "Bootstrapped Low-Voltage Analog Switches", IEEE International Symposium on Circuits and Systems, vol. II, pp. 29-32, 1999.
International Search Report and Written Opinion of the International Searching Authority in counterpart International application No. PCT/US20101056574, communication dated Jan. 31, 2011.

* cited by examiner

*Primary Examiner* — Kenneth B. Wells
(74) *Attorney, Agent, or Firm* — Kenyon & Kenyon LLP

(57) ABSTRACT

A bootstrapped switch circuit can include a switch transistor, having a drain configured as an input terminal to receive an input signal, and a voltage-controlled voltage source, configured to provide predetermined constant voltages between a gate and a source of the switch transistor in response to a control signal received at a control terminal. The predetermined constant voltages can include a first predetermined constant voltage to turn on the switch transistor and pass the input signal to the source and a second predetermined constant voltage to turn off the switch transistor. The first and second predetermined constant voltages can be independent of the magnitude of a signal passed to the source of the switch transistor based on the input signal at the drain.

20 Claims, 7 Drawing Sheets

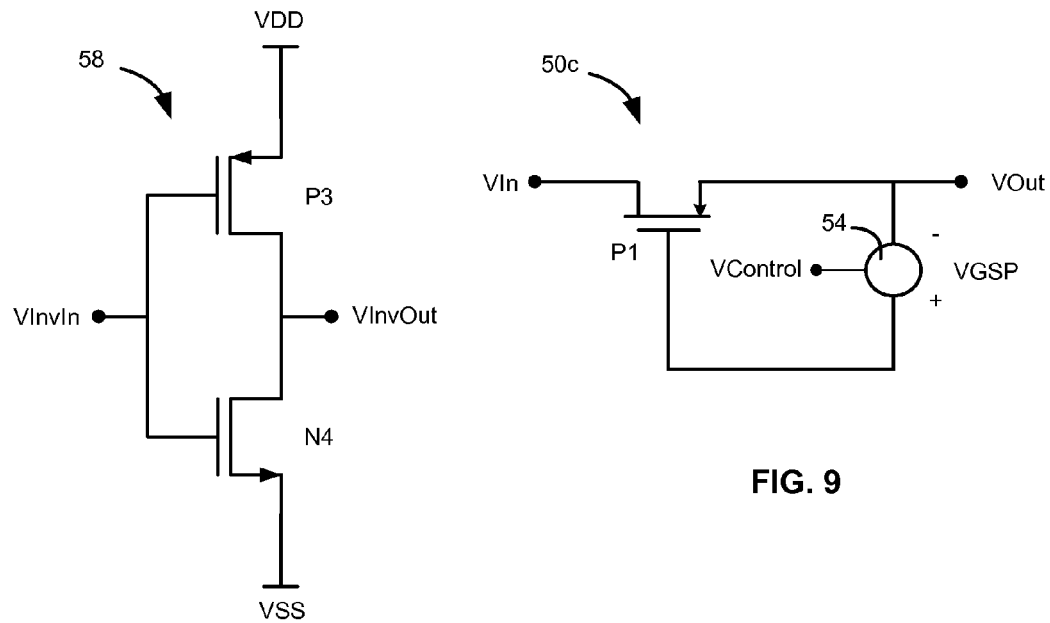
FIG. 7
FIG. 9
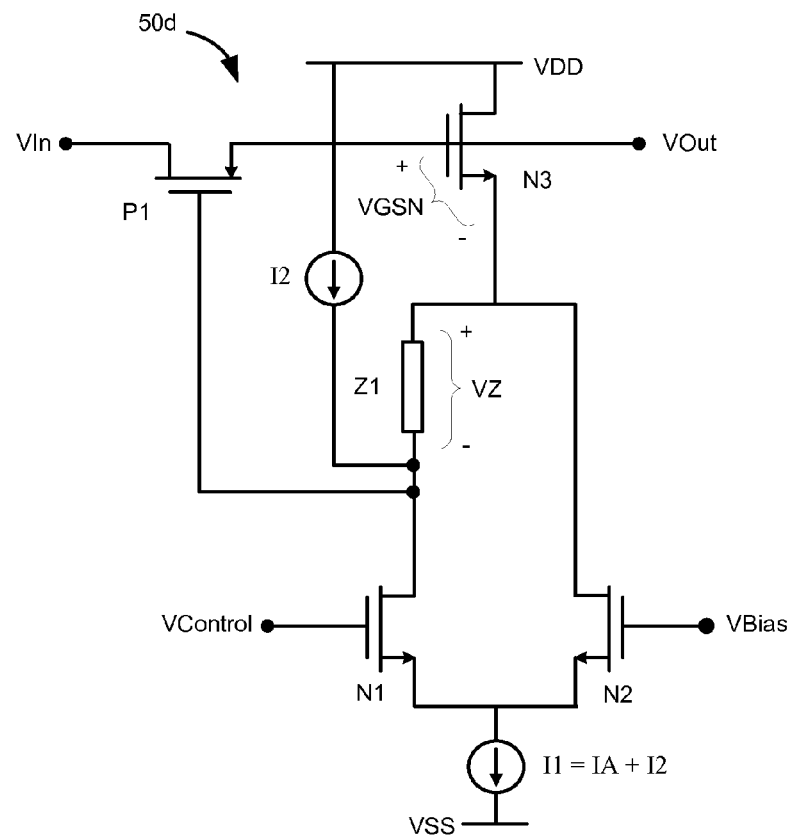
FIG. 10

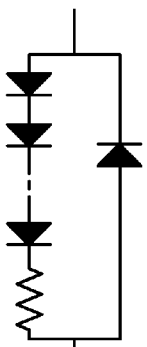
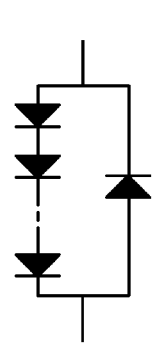
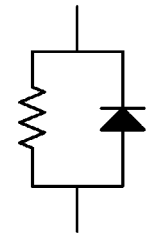
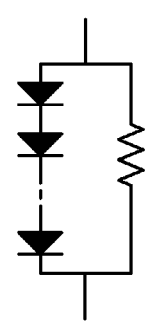
FIG. 11A     FIG. 11B     FIG. 11C     FIG. 11D     FIG. 11E
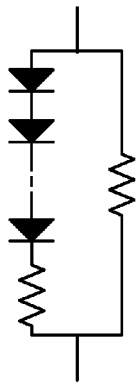
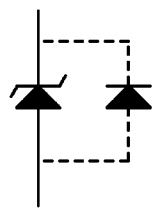
FIG. 11G
FIG. 11F
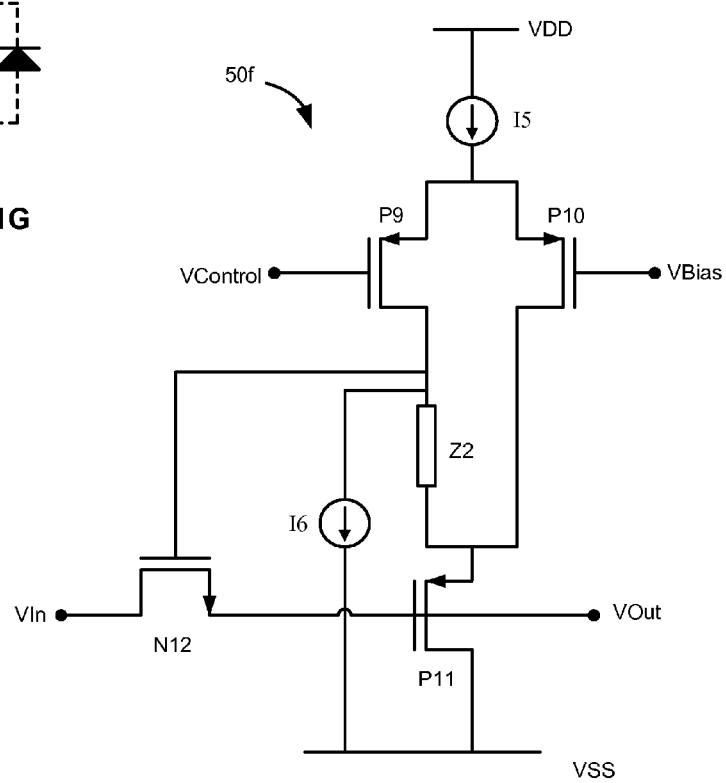
FIG. 13

US 7,952,419 B1

BOOTSTRAPPED SWITCH CIRCUIT

BACKGROUND INFORMATION

FIG. 1 depicts a switch S1 utilized as a pass gate, allowing an input signal VIn appearing on an input terminal to pass through as an output signal VOut on an output terminal in response to a control signal VControl supplied to a control terminal. Switches can be implemented using transistors in a number of ways. FIG. 2 depicts an embodiment of a transistor realization 10 of the switch S1 depicted in FIG. 1. In FIG. 2, two PMOS transistors P1, P2 are arranged in series, with a first PMOS transistor P1 having a drain configured as the input terminal to receive the input signal VIn and having its source connected to the source of a second PMOS transistor P2, and a drain of the second PMOS transistor configured as the output terminal to deliver the output signal VOut. The gates of the PMOS transistors are connected together and configured as the control terminal to receive the control signal VControl that can turn the PMOS transistors P1, P2 on, and allow the input signal VIn to pass through to the output terminal, or turn the PMOS transistors P1, P2 off, and prevent the input signal VIn from passing through to the output terminal.

The PMOS transistors P1, P2 in FIG. 2 have their back gates connected to their sources. FIG. 3 depicts a cross-sectional view of an embodiment of a PMOS device 20. Other types of transistor cross-sections are also possible, however, including DMOS, LDMOS, and NMOS cross-sections, that are usable transistor switch embodiments, including in circuits discussed herein. The PMOS transistor 20 is formed on a p-type substrate (or substrate layer) 24, and includes an n-well 28 formed in the substrate 24, p-type source and drain regions 32, 36 formed in the n-well 28, and a gate 40, usually formed from polysilicon, separated from the n-well 28 by a dielectric layer 44. The n-well 28 is sometimes referred to as a back gate, as the voltage of the n-well 28 can affect the properties of a conduction channel formed in the n-well 28 during transistor operation. Often the back gate 28 is connected to the source 32, as is depicted in FIG. 3. One problem that results from such a connection, however, is that a body diode is formed between the drain 36 and the n-well 28 and, due to the connection of the source 32 to the back gate 28, the diode also effectively appears between the drain 36 and source 32, as depicted in FIG. 2 with dashed lines (D1, D2). One reason for arranging the PMOS transistors P1, P2 in series in the embodiment of FIG. 2 is to prevent the body diodes from conducting.

One problem with the switch embodiment 10 of FIG. 3 is the difficulty of delivering a proper control signal VControl to the control terminal. Merely delivering static on and off control signal voltages, having values relative to a supply voltage, to turn the PMOS transistors P1, P2 on or off does not result in optimal switch performance. During operation when the switch is turned on, as the input signal VIn varies and is passed to the output terminal from the input terminal, along the way it passes through the node connecting the sources of the two PMOS transistors P1, P2. The gate-to-source voltage of the PMOS transistors P1, P2 will thus vary if the gate voltage is static. The on-resistance of the PMOS transistors P1, P2, i.e., the resistance the PMOS transistors P1, P2 present from drain to source, however, is a function of their gate-to-source voltage. Therefore, a varying gate-to-source voltage will generate a varying on-resistance of the PMOS transistors P1, P2, which is an undesirable operational characteristic of the switch due to the resulting unpredictability and general degradation of switch performance metrics.

Thus, there exists a need in the art for improved apparatuses and/or methods for providing and receiving signals to turn transistors on and off in transistor switch embodiments.

BRIEF DESCRIPTION OF THE DRAWINGS

So that features of the present invention can be understood, a number of drawings are described below. However, the appended drawings only illustrate particular embodiments of the invention and are therefore not to be considered limiting of its scope, for the invention may encompass other equally effective embodiments.

FIG. 7 is a circuit schematic depicting an embodiment of an inverter.

FIG. 9 is a circuit schematic depicting another embodiment of the bootstrapped switch circuit having a PMOS switching transistor.

FIG. 10 is a circuit schematic depicting an embodiment of the bootstrapped switch circuit depicted in FIG. 9.

FIGS. 11A, 11B, 11C, 11D, 11E, 11F and 11G are circuit schematics depicting embodiments of bidirectional circuit elements that can be used in the bootstrapped switch circuit.

FIG. 13 is a circuit schematic depicting an embodiment of the bootstrapped switch circuit having an NMOS switching transistor.

DETAILED DESCRIPTION OF EXAMPLE EMBODIMENTS

An embodiment of a bootstrapped switch circuit can include a switch transistor, having a drain configured as an input terminal to receive an input signal, and a voltage-controlled voltage source, configured to provide predetermined constant voltages between a gate and a source of the switch transistor in response to a control signal received at a control terminal. The predetermined constant voltages can include a first predetermined constant voltage to turn on the switch transistor and pass the input signal from the drain to the source and a second predetermined constant voltage to turn off the switch transistor. The first and second predetermined constant voltages can be independent of the magnitude of the input signal passed from the drain to the source of the switch transistor.

Figure 1:
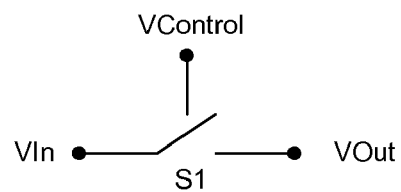
FIG. 1 is a circuit schematic depicting an embodiment of a switch.
Figure 2:
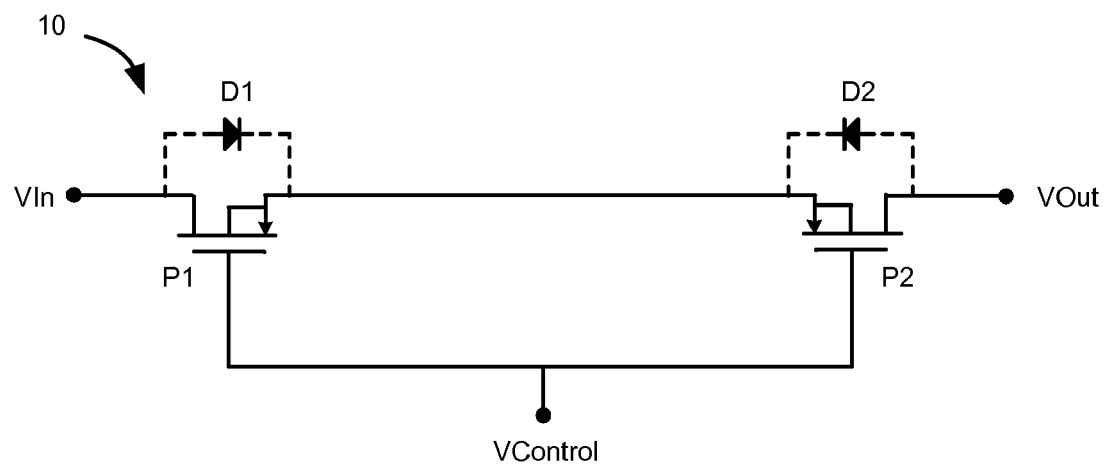
FIG. 2 is a circuit schematic depicting an embodiment of a transistor implementation of the switch.
Figure 3:
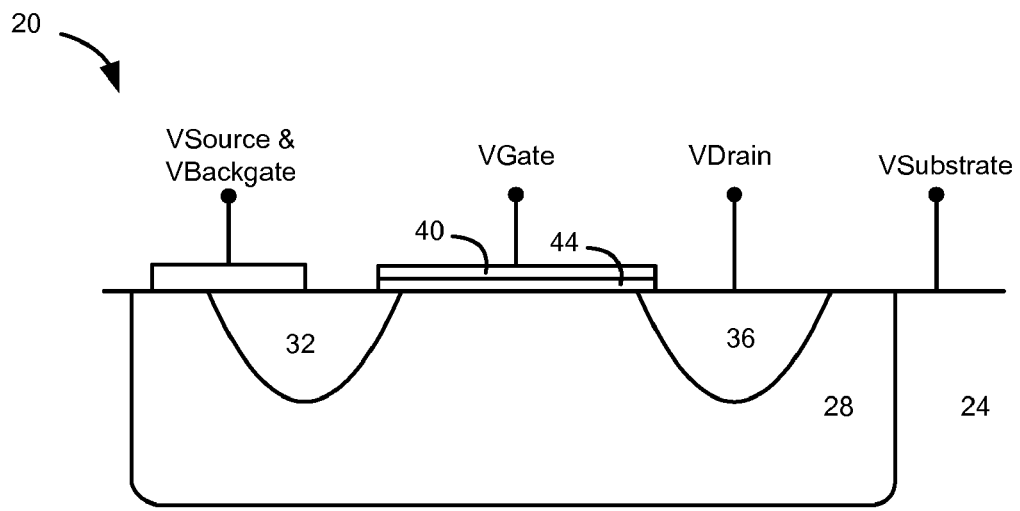
FIG. 3 depicts a cross-sectional view of a PMOS transistor having a source and back gate connected together.
Figure 4:
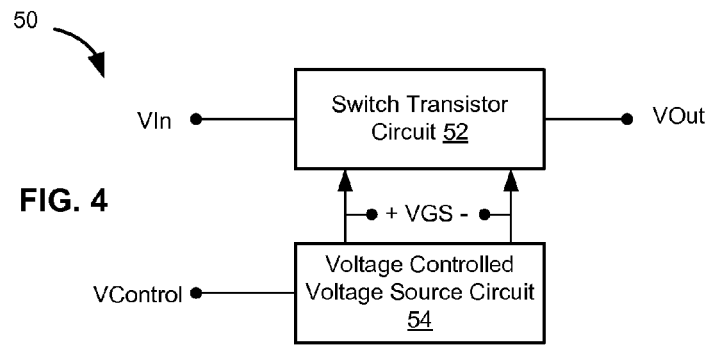
FIG. 4 is a circuit schematic depicting an embodiment of a bootstrapped switch circuit.

FIG. 4 depicts an embodiment of a bootstrapped switch circuit 50 that can be configured to provide predetermined constant gate-to-source voltages VGS, in response to a control signal VControl, to control turning on and off of at least one switch transistor, the predetermined constant gate-to-source voltages VGS being independent of an input signal VIn provided to an input terminal of the bootstrapped switch circuit 50. The bootstrapped switch circuit 50 can include a switch transistor circuit 52, having the at least one switch transistor, and a voltage-controlled voltage source circuit 54, configured to provide the predetermined constant gate-to-source voltages VGS to the switch transistor circuit 52.

Figure 5:
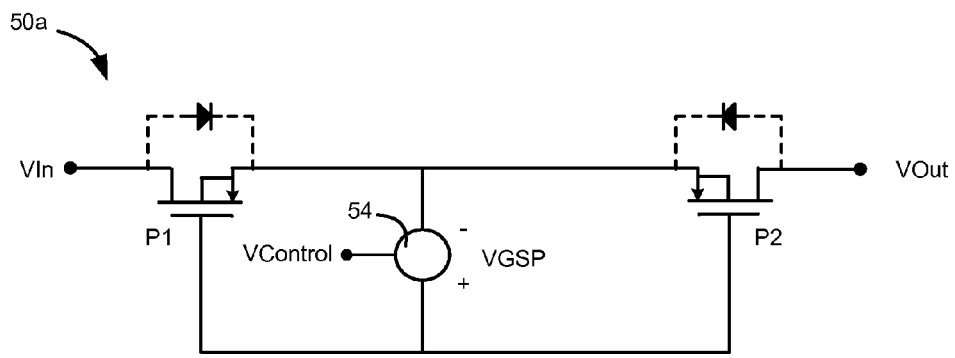
FIG. 5 is a circuit schematic depicting an embodiment of a bootstrapped switch circuit having PMOS switching transistors.

FIG. 5 depicts an embodiment of a bootstrapped switch circuit 50a having PMOS switch transistors P1, P2. The depicted bootstrapped switch circuit 50a can be configured to provide predetermined constant gate-to-source voltages VGSP (i.e., the predetermined constant gate-to-source voltage VGS as applied to PMOS switching transistors), in response to a control signal VControl, to control turning on and off of the switch transistors P1, P2, the predetermined constant gate-to-source voltages VGSP being independent of an input signal VIn provided to an input terminal of the bootstrapped switch circuit 50a. The switch transistor circuit 51 of the embodiment of the bootstrapped switch circuit 50a can include the pair of PMOS transistors P1, P2, arranged in series, with a first of the two PMOS transistors P1 having a drain configured as an input terminal of the bootstrapped switch circuit 50a to receive the input signal VIn and a source connected to a source of a second of the PMOS transistors P2, which has a drain configured as the output terminal of the bootstrapped switch circuit 50a to deliver the output signal VOut. The sources of each of the PMOS transistors P1, P2 can be connected to the back gate of that PMOS transistor.

The bootstrapped switch circuit 50a can include the voltage-controlled voltage source 54 connected between the connected sources and connected gates of the two PMOS transistors P1, P2. The voltage-controlled voltage source 54 can be configured to supply the predetermined constant gate-to-source voltages VGSP, in response to the control signal VControl, between the gates and sources of the PMOS transistors P1, P2 to control their turning on and off. A first value VConst1 of the predetermined constant gate-to-source voltages VGSP can be supplied to turn on the PMOS transistors P1, P2, and a second value VConst2 of the predetermined constant gate-to-source voltages VGSP can be supplied to turn off the PMOS transistors P1, P2.

The first value VConst1 of the supplied gate-to-source voltages VGSP, which turns on the PMOS transistors P1, P2, can be thought of as having two components: a threshold voltage VTHP and an overdrive voltage VODP. The threshold voltage is the amount of gate-to-source voltage required to fully turn on the PMOS transistors P1, P2. A value of the gate-to-source voltage VGSP below the threshold voltage VTHP will result in the PMOS transistors P1, P2 not being fully turned on. The overdrive voltage VODP is the amount of voltage supplied between the gate and source of the PMOS transistors P1, P2 in excess of the minimal amount required to fully turn on the device, i.e., in excess of the threshold voltage VTHP. The value of the overdrive voltage VODP can affect various performance metrics of the PMOS transistors P1, P2, such as their on-resistance, and can be chosen to have a predetermined value based on a desired level of circuit performance of the bootstrapped switch circuit 50. The voltage-controlled voltage source 54, in supplying the first value VConst1 of the predetermined constant gate-to-source voltages VGSP, thus can effectively supply the sum of the threshold voltage VTHP plus a predetermined overdrive voltage VODP to achieve a predictable desired level of circuit performance.

As discussed herein, the predetermined constant gate-to-source voltages VGSP supplied by the voltage-controlled voltage source 54 can be constant to within a degree that accounts for normal circuit operation variation due to temperature changes or noise. That is, the predetermined constant gate-to-source voltages VGSP can be constant in that they are DC voltage values, rather an AC voltage values, and do not have an intentional time-varying component other than changing from the first value VConst1 of the predetermined constant gate-to-source voltages VGSP to the second value VConst2 of the predetermined constant gate-to-source voltages VGSP in response to a change in logic state of the control signal VControl. The potential drift of the predetermined constant gate-to-source voltages VGSP supplied by the voltage-controlled voltage source 54 due to temperature, noise, or other similar effects on circuit operation is still considered constant in the context of the description herein.

Moreover, although it is common to refer to the voltage between the gate and source of a PMOS device as a gate-to-source voltage, it is to be borne in mind that for a PMOS device to turn on, the gate-to-source voltage, as measured as the gate voltage minus the source voltage, is a negative quantity. That is, to turn on a PMOS device, the gate voltage is brought to a value sufficiently below the value of the source. Thus, as discussed herein, supplying a gate-to-source voltage to the PMOS devices P1, P2 to turn on the PMOS devices P1, P2 means supplying a sufficiently negative gate to source voltage to the PMOS devices P1, P2, as measured as the gate voltage minus the source voltage. Alternatively, it is also possible to instead discuss the gate-to-source voltage as a source-to-gate voltage, and in which case the necessary source-to-gate voltage to turn on a PMOS device would be a positive quantity.

Figure 6:
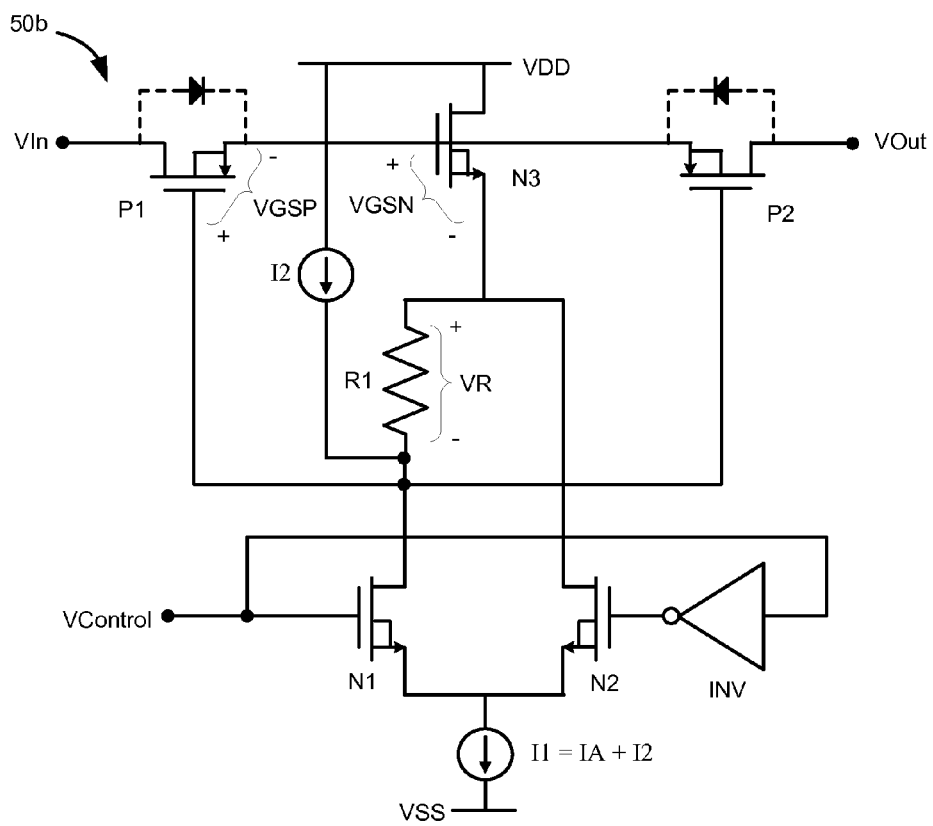
FIG. 6 is a circuit schematic depicting an embodiment of the bootstrapped switch circuit depicted in FIG. 5.

FIG. 6 depicts an embodiment 50b of the bootstrapped switch circuit of FIG. 5. In FIG. 6, the voltage-controlled voltage source 54 can include first and second NMOS transistors N1, N2, a resistor R1, a third NMOS transistor N3, a first current source I1, a second current source I2, and an inverter INV. The first and second NMOS transistors N1, N2 can be configured as a differential pair having sources connected together. The gate of the first NMOS transistor N1 can be configured as the control terminal of the bootstrapped switch circuit 50b to receive the control signal VControl. The gate of second NMOS transistor N2 can be configured to receive an inverse of the control signal VControl, generated by the action of the inverter INV, which is connected between the gates of the first and second NMOS transistors N1, N2. FIG. 7 depicts an embodiment 58 of the inverter INV, having an NMOS transistor N4 and a PMOS transistor P3 configured to perform the inversion by having their gates connected together and serving as an input terminal and their sources connected together and serving as an output terminal. Returning to FIG. 6, the resistor R1 can be connected between the drain of the first NMOS transistor N1 and a node connecting the drain of the second NMOS transistor N2 and the source of the third NMOS transistor N3. The third NMOS transistor N3 can have a gate connected to the connected sources of the first and second PMOS transistors P1, P2, and a drain connected to a power supply VDD.

The first current source I1 draws a first current I1 (=IA+I2) from the connected sources of the first and second differential-pair NMOS transistors N1, N2. The second current source I2 provides a second current I2 to the node connecting the resistor R1, the drain of the first NMOS transistor N1, and the gates of the first and second PMOS transistors P1, P2. The first and second current sources I1, I2 are depicted in FIG. 6 as schematically connected between nodes of the bootstrapped switch circuit 50b and negative or positive power supplies VSS, VDD, respectively. The current sources I1, I2 can be implemented in a variety of ways, and one possible implementation is discussed below in reference to a current source circuit embodiment in FIG. 8. Other implementations of these current sources are possible, however, and be consistent with the operation of the bootstrapped switch circuit 50 discussed herein.

In operation, the input signal VIn can be supplied to the input terminal and the control signal VControl can be supplied to the control terminal of the bootstrapped switch circuit 50. The input signal VIn can either be passed from the input terminal to the output terminal when the control signal VControl indicates to the bootstrapped switch circuit 50 to pass the input signal, or be blocked from passing to the output terminal when the control signal VControl indicates to the bootstrapped switch circuit 50 to block the passage of the input signal VIn. The input signal VIn typically represents information be manipulated in a larger circuit having the bootstrapped switch circuit 50, and can be either an analog, digital, or mixed signal. The control signal VControl represents control instructions delivered to the bootstrapped switch circuit 50 and is typically a digital signal. As a digital signal, the control signal VControl can assume logic high and logic low states. The bootstrapped switch circuit 50 can be configured to pass the input signal VIn to the output terminal when the control signal VControl assumes one of these logic states, e.g., the logic high state as in the configuration depicted in FIG. 6, and block the input signal VIn from passing to the output terminal when the control signal VControl assumes the other of these logic states, e.g., the logic low state as in the configuration depicted in FIG. 6. The assignment of pass and block behavior of the bootstrapped switch circuit 50 to particular logic states of the control signal VControl can be reversed, however, by, e.g., configuring the gate of the second NMOS transistor N2 as the input terminal and connecting the inverter INV between such an input terminal and the gate of the first NMOS transistor N1.

When the control signal VControl assumes a logic high state, the first NMOS transistor N1 is turned on and the second NMOS transistor N2 is turned off. The first current I1 is entirely drawn through the first NMOS transistor N1. The second current source I2 also provides a current I2 to the first NMOS transistor N1, and thus the current drawn through the resistor R1 and the third NMOS transistor N3 is equal to the first current minus the second current, by simple current summing at the drain of the first NMOS transistor, or I(R1, N3)=I1−I2=(IA+I2)−I2=IA. The bootstrapped switch circuit is configured so that the current IA flowing through the resistor R1 and the third NMOS transistor N3 in this mode (i.e., in response to the logic high value of the control signal VControl) produces a voltage VR across the resistor R1 and a voltage VGSN across the gate and source of the third NMOS transistor N3 that supplies the first predetermined constant value VConst1 of the predetermined constant gate-to-source voltages VGSP supplied to the first and second PMOS transistors P1, P2. This is due to the gates and sources of the PMOS transistors P1, P2 being connected across the same circuit nodes as the sum of the circuit path from the gate to the source of the third NMOS transistor N3 and then across the resistor R1. This relationship can be expressed as follows: VConst1=VGSP=VGSN+VR=VGSN+IA*R1, where VR and VGSN are functions of IA.

When the control signal VControl assumes a logic low state, the first NMOS transistor N1 is turned off and the second NMOS transistor N2 is turned on. The first current I1 is thus entirely drawn through the second NMOS transistor N2. The second current source I2 still provides the second current I2 to the node connecting the resistor R1 and the drain of the first NMOS transistor N1. However, since the first NMOS transistor N1 is now turned off, the second current I2 must now flow through the resistor R1 instead of the first NMOS transistor N1, thus reversing the flow of the current through the resistor R1 (in comparison to operation of the bootstrapped switch circuit 50 when the control signal VControl assumes the logic high state, as discussed above). Thus, the second current I2 now flows through the resistor R1 and a current equal to the first current minus the second current, or (IA+I2)−I2=IA, again flows through the third NMOS transistor N3, as a result of a current summing at the node connecting the resistor R1, the source of the third NMOS transistor N3, and the drain of the second NMOS transistor N2. This results in a gate-to-source voltage VGSP delivered to the first and second PMOS transistors equal to the value of the gate-to-source voltage VGSN of the third NMOS transistor N3 minus the voltage VR across the resistor R1, or VGSP=VGSN−VR=VGSN−I2*R1. The bootstrapped switch circuit is configured so that the currents I2 and IA, flowing through the resistor R1 and third NMOS transistor N3, respectively, produce a second predetermined constant value VConst2 of the predetermined constant gate-to-source voltages VGSP to the first and second PMOS transistors P1, P2 in response to the logic low value of the control signal VControl. The second predetermined constant value VConst2 of the predetermined gate-to-source voltages VGSP of the PMOS transistors P1, P2 can be selected to provide a desired off state of the PMOS transistors P1, P2. For example, the second predetermined constant value VConst2 can be selected to be zero, or some other similar low-value voltage that ensures the PMOS transistors P1, P2 are fully off and correctly block the input signal VIn from reaching the output terminal of the bootstrapped switch circuit 50. Such an example can be expressed as follows: VConst2=VGSN−VR=VGSN−I2*R1, or VGSN−VConst2=I2*R1, or I2=(VGSN−VConst2)/R1, where VGSN is a function of IA and VR is a function of I2. In the situation where the second predetermined constant value VConst2 is selected to be zero, the relationships can be expressed as follows: 0=VGSN−VR=VGSN−I2*R1, or VGSN=I2*R1, or I2=VGSN/R1.

As can be seen from the above, the bootstrapped switch circuit 50 can set the predetermined constant gate-to-source voltages VGSP of the PMOS transistors to first and second predetermined constant values VConst1, VConst2 in response to the first and second logic values of the control signal VControl. The first and second predetermined constant values VConst1, VConst2 can be selected by configuring the operational parameters of the bootstrapped switch circuit 50, including the value of the currents IA and I2 and the size and properties of the third NMOS transistor N3 and the resistor R1, which control the values of VGSN and VR as functions of the currents IA and I2.

Figure 8:
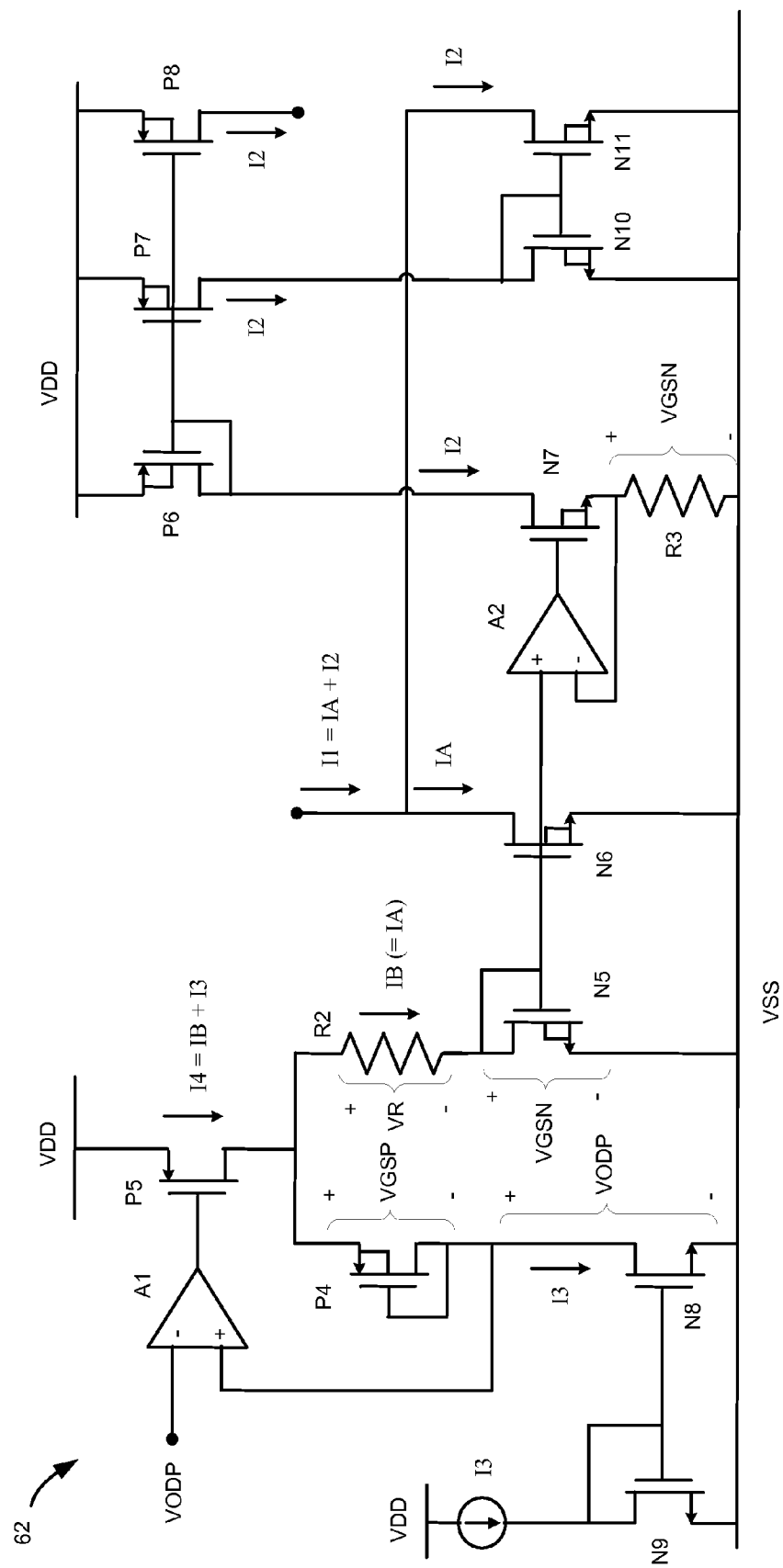
FIG. 8 is a circuit schematic depicting an embodiment of a current source circuit for supplying predetermined currents to the bootstrapped switch circuit.

FIG. 8 depicts one embodiment of a current source circuit 62 configured to provide the first and second current sources I1, I2. Other embodiments of the first and second current sources I1, I2 are also possible. In FIG. 8, two parallel branches of the circuit are used to enforce a voltage equality to produce the desired currents. In a first branch, a diode connected PMOS transistor P4 is connected in series with an NMOS transistor N8. The NMOS transistor N8 draws a third current I3 from the diode connected PMOS transistor P4, as a result of its gate being connected to a diode connected (crowbar configured) NMOS transistor N9, and thus replicating the current in NMOS transistor N9, the third current I3 delivered by a third current source I3. The value of the third current I3 can be selected to be a relatively small value, or can be selected based on other circuit considerations. In the second branch, connected in parallel with the first branch, a resistor R2 is connected in series with a diode connected (crowbar configured) NMOS transistor N5. The two parallel branches are supplied with a fourth current I4 (=IB+I3) by PMOS transistor P5. The value of the fourth current I4 is controlled by the connection of differential-input single-ended-output amplifier A1 arranged in a negative feedback configuration, having its output connected to the gate of the PMOS transistor P5, its positive input terminal connected to the circuit node connecting the diode connected PMOS transistor P4 and the drain of the NMOS transistor N8, and its negative terminal connected to a control voltage (given the desired value of the overdrive voltage VODP, as discussed below).

In operation, the two parallel circuit branches are connected across the same circuit nodes, and thus the voltages across each of these branches must be equal. This can be expressed as follows: VGSP4+VDSN8=VR2+VGSN5, where VGSP4 is the gate-to-source voltage of PMOS transistor P4, VDSN8 is the drain-to-source voltage of NMOS transistor N8, VR2 is the voltage across the resistor R2, and VGSN5 is the gate-to-source voltage of the NMOS transistor N5. Through the feedback action of the negative feedback loop including the amplifier A1, the PMOS transistor P5, and the diode-connected PMOS transistor P4, the control voltage present at the negative input terminal of the amplifier A1 is effectively enforced at the positive input terminal and thus at the node connecting the diode-connected PMOS transistor P4 and the NMOS transistor N8. The circuit of FIG. 8 can be configured such that the control voltage delivered to the negative input terminal of the amplifier A1 has a value equal to the desired value of the predetermined constant overdrive voltage VODP to be delivered as part of the first value VConst1 of the predetermined constant gate-to-source voltage VGSP to the first and second PMOS transistors P1, P2 when these transistors are turned on by the control signal VControl. Furthermore, the gate-to-source voltage of the PMOS transistor P4 can be expressed as a sum of its threshold voltage and an overdrive component, or VGSP4=VTHP4+VODP4. If the third current I3 has a relatively small value, then the overdrive component VODP4 will be relatively small, and the gate-to-source voltage of the PMOS transistor P4 will be approximately equal to its threshold voltage, or VGSP4=VTHP4. The PMOS transistor can be fabricated to have the same threshold voltage as that of the first and second PMOS transistors P1, P2, so that VTHP4=VTHP, and thus the gate-to-source voltage of the PMOS transistor P4 will be approximately equal to the threshold voltage of the first and second PMOS transistors P1, P2, or VGSP4=VGSP. Thus, one side of the above voltage equality can be selected so that VGSP4+VDSN8=VTHP+VODP. This voltage sum is the voltage desired to be implemented as the first value VConst1 of the predetermined constant gate-to-source voltage VGSP supplied to turn on the first and second PMOS transistors P1, P2.

Voltage quantities in the other side of the above voltage equality, resulting from the parallel connection of the first and second circuit branches in FIG. 8, can also be selected to generate first and second currents I1, I2 to achieve desired values of the predetermined constant gate-to-source voltages VGSP supplied to the first and second PMOS transistors P1, P2 in the bootstrapped switch circuit 50b. The diode connected (crowbar configured) NMOS transistor N5 can be constructed to replicate the third NMOS transistor N3 from the bootstrapped switch circuit 50b of FIG. 6, e.g., by forming both NMOS transistors on the same chip, using the same process, and having the same size and layout. Likewise, the resistor R2 can be constructed to have the same resistance value as the resistor R1 in the bootstrapped switch circuit 50b of FIG. 6, e.g., by forming the two resistors on the same chip, using the same process, and having the same size and layout. Recalling from the discussion above of FIG. 6, when the control signal VControl turns on the first and second PMOS transistors P1, P2, the gate-to-source voltage VGSP supplied to the first and second PMOS transistors P1, P2 equals the sum of the gate-to-source voltage VGSN of the third NMOS transistor N3 and the voltage VR across the resistor R1, or VGSP=VGSN+VR=VGSN+IA*R1. Also recalling that the gate-to-source voltage VGSP of the first and second PMOS transistors can be expressed as VGSP=VTHP+VODP, then, substituting into the previous equation, VTHP+VODP=VGSN+IA*R1. Since the above voltage equality created by the first and second parallel circuit branches, VGSP4+VDSN8=VR2+VGSN5, can be selected through circuit configuration to be such that VTHP+VODP=VR2+VGSN5, we can arrive at VGSN+IA*R1=VR2+VGSN5. Thus, if NMOS transistor N5 in FIG. 8 replicates the third NMOS transistor N3 in FIG. 6, and if resistor R2 has the same value as resistor R1, we can arrive at VGSN+IA*R1=IB*R1+VGSN, or IA*R1=IB*R1, or IA=IB. Thus, through the above circuit configuration, the current IB has been selected to equal the current IA required to implement the first value VConst1 of the predetermined constant gate-to-source voltages VGSP supplied to the first and second PMOS transistors P1, P2 to implement the desired VGSP=VTHP+VODP, where VODP is a selected predetermined constant overdrive voltage. Delivering current IA, so generated, enabling the bootstrapped switch circuit 50 to deliver the predetermined constant value of VODP to the first and second PMOS transistors P1, P2 when the control voltage VControl turns them on, enables realization of constant, predetermined on-state parameters of the first and second PMOS transistors P1, P2 such as, e.g., a constant, predetermined on resistance.

The current source circuit 62 of FIG. 8 can also be configured to provide a predetermined value of the second current I2 to select the second value VConst2 of the predetermined constant gate-to-source voltages VGSP supplied to the first and second PMOS transistors P1, P2 of the bootstrapped switch circuit 50b when the control signal VControl turns off these transistors. Recalling from the above discussion of FIG. 6, the second predetermined constant value VConst2 of the predetermined gate-to-source voltage VGSP of the PMOS transistors P1, P2 can be selected to be zero, or some other similar low-value voltage that ensures the PMOS transistors are fully off and correctly block the input signal from reaching the output terminal of the bootstrapped switch circuit 50b, by selecting the second current I2 as follows: I2=(VGSN−VConst2)/R1. The current source circuit 62 of FIG. 8 can be used to produce such a second current I2. For example, to select the second predetermined constant value VConst2 to be zero, then the second current I2 is selected to have the value I2=VGSN/R1. As discussed above, the gate-to-source voltage VGSN of the third NMOS transistor N3 in FIG. 6 is a function of IA, and the NMOS transistor N5 in FIG. 8 is selected to replicate the third NMOS transistor N3, and also has a drain current having a value of IA. Thus, the gate-to-source voltage of the NMOS transistor N5 is also VGSN, and this voltage value is imposed across a third resistor R3 through the feedback action of a second amplifier A2 and NMOS transistor N7 in FIG. 8, in which the amplifier A2 is configured to receive VGSN at its positive input terminal, deliver an output voltage to the gate of NMOS transistor N7, and sample the voltage across the resistor R3 at its negative input terminal. The value of resistor R3 can then be selected to be the same as that of the resistor R1 in FIG. 6, e.g., by forming the two resistors on the same chip, using the same process, and having the same size and layout, and thus the current running through the resistor R3 equals VGSN/R1, the desired value of I2. This current can then be replicated by PMOS transistors P6 and P8 to produce an embodiment of the second current source I2 that can be connected into the bootstrapped switch circuit 50*b* of FIG. 6. Similarly, the second current I2 so produced can be replicated by PMOS transistor P7 and NMOS transistors N10 and N11, and then added to the current IA replicated by the NMOS transistor N6 to produce the first current source I1=IA+I2, which can be connected into the bootstrapped switch circuit 50*b* of FIG. 6.

Although FIG. 8 depicts one embodiment of a current source circuit 62 that can be used to implement the first and second current sources I1, I2, other embodiments of current source circuits can also be utilized to generate the first and second currents I1, I2 and still result in useful and desirable operation of the bootstrapped switch circuit 50*b* of FIG. 6. For example, any current source circuit or circuits that produce currents having selectable values can be used to generate the first and second currents I1, I2 having selectable values that enable generation of the desired first and second constant predetermined values VConst1, VConst2 of the gate-to-source voltage VGSP supplied to the first and second PMOS transistors P1, P2 to turn these transistors on and off. That is, any current source circuit or circuits, which that produce currents having selectable values, can be used to generate the first and second currents I1, I2 having values that generate the desired first and second values VConst1, VConst2 of the predetermined constant gate-to-source voltages VGSP supplied to the first and second PMOS transistors P1, P2 according to VConst1=VGSP=VGSN+VR=VGSN+IA*R1, and VConst2=VGSN−VR=VGSN−I2*R1, where VGSN is a function of IA. These equations can be solved to determine the necessary values of IA and I2 (and thus of I1), to be produced by a given current source circuit, in order to generate the first and second constant values VConst1, VConst2 of the predetermined constant gate-to-source voltages VGSP supplied to the first and second PMOS transistors P1, P2.

Other embodiments of the bootstrapped switch circuit 50 exist that also deliver the predetermined constant gate-to-source voltages VGS to a switch transistor or transistors. FIG. 9 depicts another embodiment of the bootstrapped switch circuit 50*c* having the voltage-controlled voltage source 54 delivering the predetermined gate-to-source voltages VGSP to a single PMOS switch transistor P1 instead of two PMOS switch transistors P1, P2 arranged in series. The voltage-controlled voltage source 54 in FIG. 9 can be implemented the same as it is implemented in FIG. 6, or with optional modifications. FIG. 10 depicts an embodiment of the bootstrapped switch circuit 50*d* of FIG. 9. The voltage-controlled voltage source 54 has essentially the same architecture as that of FIG. 6, although with some optional modifications included. (The exact same architecture of the voltage-controlled voltage source 54 of FIG. 6 could also be used in an embodiment of the bootstrapped switch circuit 50*d* of FIG. 10, however.) In one optional modification of the embodiment of the voltage-controlled voltage source architecture, the resistor R1 is replaced by a bidirectional circuit element Z1. The bidirectional circuit element Z1 can take the form of a variety of embodiments, so long as it is capable of bidirectional current flow, in order to replicate or approximate the functional behavior of the resistor R1 in FIG. 6. FIGS. 11A, 11B, 11C, 11D, 11E, 11F and 11G depict exemplary embodiments of bidirectional circuits that can be used to implement the bidirectional circuit element Z1 of FIG. 10, including in FIG. 11A the original resistor embodiment of FIG. 6. In another optional modification, the current-steering differential pair of NMOS transistors N1, N2 are configured to receive the control voltage VControl and a bias voltage VBias, respectively, instead of the control voltage VControl and its inverse, as in FIG. 6. Selection of an appropriate bias voltage VBias can result in essentially the same operation of the current-steering differential pair N1, N2 as if the inverse of the control voltage VControl was delivered to the second NMOS transistor N2.

Figure 12:
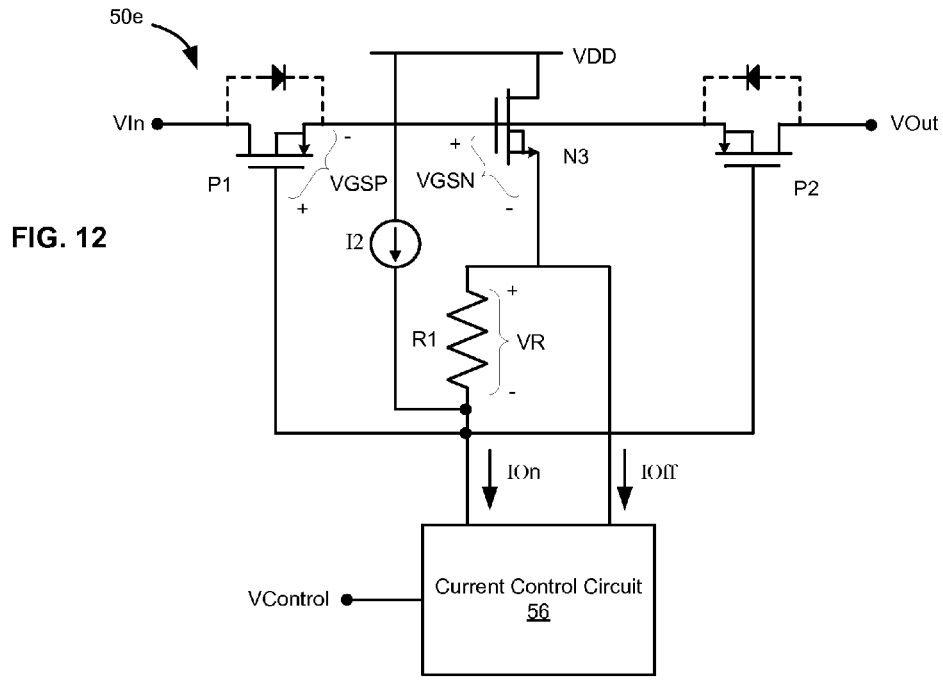
FIG. 12 is a circuit schematic depicting another embodiment of the bootstrapped switch circuit having PMOS switching transistors.

The functionality of the current-steering transistors N1, N2 and associated circuitry, e.g., to perform the steering of the first current I1 into the resistor R1 and the third NMOS transistor N3 in a selected manner in response to the control signal VControl, can be implemented by various embodiments instead of or in addition to the differential-pair configuration of the first and second NMOS transistors N1, N2 depicted in FIG. 6. FIG. 12 depicts an embodiment of the bootstrapped switch circuit 50*e* having a current control circuit 56 configured to provide the first current I1 into one of two current branches, labeled IOn and IOff in FIG. 12, in response to the control signal VControl. That is, to provoke the on state of the switch transistors P1, P2, the current control circuit 56 can provide the first current I1 into the IOn branch and zeroes (or lowers, as discussed below) the current in the IOff branch, and to provoke the off state of the switch transistors P1, P2, the current control circuit 56 can provide the first current I1 into the IOff branch and zeroes (or lowers) the current in the IOn branch. The current control circuit 56 can be implemented with any circuit that is configured to provide the first current I1 into either the IOn or IOff branches in response to the control signal VControl in the same manner as discussed above in regard to the current steering provided by first and second NMOS transistors N1, N2 of the first current I1 into the resistor R1 and the third NMOS transistor N3 in response to the control signal VControl. An exemplary embodiment of the current control circuit 56 is discussed below in regard to FIG. 14.

The embodiments of the bootstrapped switch circuit 50 discussed above, e.g., embodiments 50*a*, 50*b*, 50*c*, 50*d*, 50*e* of FIGS. 5, 6, 9, 10 and 12, all contain PMOS switch transistors (e.g., first PMOS switch transistor P1 or first and second PMOS transistors P1, P2). However, other embodiments of the bootstrapped switch circuit 50 can instead or additionally include NMOS switch transistors. The bootstrapped switch circuit 50 can include any or all of the following variations: a single PMOS switch transistor (e.g., single PMOS switch transistor P1 in FIGS. 9 and 10), two PMOS switch transistors connected in series (e.g., first and second PMOS switch transistors P1, P2 in FIGS. 5 and 6), a single NMOS switch transistor, two NMOS switch transistors connected in series, a single PMOS switch transistor and a single NMOS switch transistor connected in parallel, or two PMOS switch transistors (connected in series with each other) connected in parallel with two NMOS switch transistors (connected in series with each other). The above various combinations of PMOS and NMOS switch transistors are only exemplary, however, and other combinations are possible. Portions of embodiments of the bootstrapped switch circuit 50 including NMOS switch transistors can essentially be translations of the PMOS-switchtransistor bootstrapped switch embodiments discussed above that appropriately replace PMOS transistors with NMOS transistors and vice versa.

FIG. 13 depicts an exemplary translation of the PMOS-switch-transistor embodiment 50d of the bootstrapped switch circuit 50 to an NMOS-switch-transistor embodiment 50f. In FIG. 13, NMOS transistor N12 takes the place of PMOS transistor P1, PMOS transistors P9, P10 take the place of NMOS transistors N1, N2, and PMOS transistor P11 takes the place of NMOS transistor N3. Similarly, the directionality of the current sources is reversed, but their functionality remains substantially the same, with current source I5 taking the place of current source I1, and current source I6 taking the place of current source I2. Bidirectional circuit element Z2 can be implemented by any of the embodiments depicted in FIGS. 11A-11G, either as depicted or vertically mirrored. The operation and configuration of the NMOS-switch-transistor embodiment 50f of FIG. 13 is substantially the same as discussed above for the PMOS-switch-transistor embodiments. Additionally, any of the above-discussed PMOS-switch-transistor embodiments of the bootstrapped switch circuit 50, optionally including any optional modifications, can be translated to NMOS-switch-transistor embodiments, or combined PMOS- and NMOS-switch-transistor embodiments, of the bootstrapped switch circuit 50.

Figure 14:
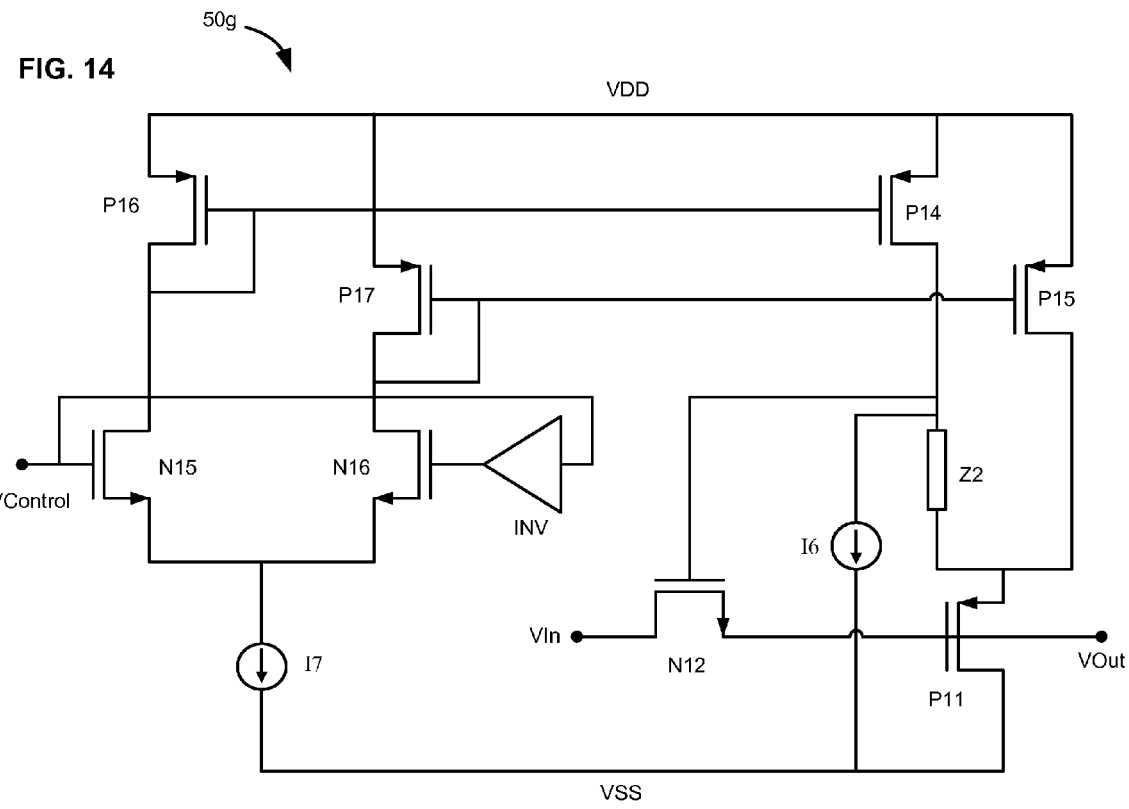
FIG. 14 is a circuit schematic depicting another embodiment of the bootstrapped switch circuit having an NMOS switching transistor.

FIG. 14 depicts an embodiment of the bootstrapped switch circuit 50g having the NMOS switch transistor N12 and an embodiment of the current control circuit 56 instead of, e.g., the current-steering differential-pair PMOS transistors P9, P10 of FIG. 13. The current control circuit 56 can include NMOS differential-pair transistors N15, N16 steering a seventh current I7 selectively into PMOS current-mirror transistors P16, P17 in response to the control signal VControl. The current I7 can be a vertically mirrored version of the fifth current I5 in FIG. 13, e.g., substantially the same as the first current I1. The PMOS current mirror transistors P16, P17 then mirror the current they receive into PMOS transistors P14, P15, which can deliver the current to the bidirectional circuit element Z2 and the PMOS transistor P11 in the manner as accomplished by the PMOS transistors P9, P10 in FIG. 13. The embodiment of the current control circuit 56 depicted in FIG. 14 can also be translated to an embodiment suitable for use in a PMOS-switch-transistor embodiment of the bootstrapped switch circuit 50 by suitably translating PMOS to NMOS transistors and vice versa.

Additional embodiments of the bootstrapped switch circuit 50 are also possible. The selective steering of currents in response to the control voltage VControl, e.g., the steering of the first current I1 by the NMOS transistors N1, N2 in FIG. 6, can either be absolute or partial. For example, the steering of the first current I1 through one or the other of the first and second NMOS transistors N1, N2, to produce either the first or second predetermined constant values VConst1, VConst2 of the of the predetermined constant gate-to-source voltages VGSP, can completely steer the first current I1 through either the first or second NMOS transistor N1, N2, and thus reduce to zero the current in the other of the first or second NMOS transistor N1, N2, or can instead merely create predetermined imbalances between the currents in the first and second NMOS transistors N1, N2, to produce the first or second predetermined constant values VConst1, VConst2 of the predetermined constant gate-to-source voltages VGSP.

Also, in other embodiments, the currents used to select the first or second predetermined constant values VConst1, VConst2 of the of the predetermined constant gate-to-source voltages VGSP, e.g., the first and second currents I1, I2 or the corresponding currents in various embodiments, can have either constant or time-varying values. For example, the first and second currents I1, I2 can optionally assume different values when the switching transistor or transistors (e.g., PMOS transistors P1, P2) are turned on compared to when they are turned off. Embodiments can optionally include a dynamic boost component of either or both of the first and second currents I1, I2 (or the corresponding currents in various embodiments) to quickly charge or discharge nodes in order to minimize the time it takes to turn on or off the switching transistors.

Figure 15:
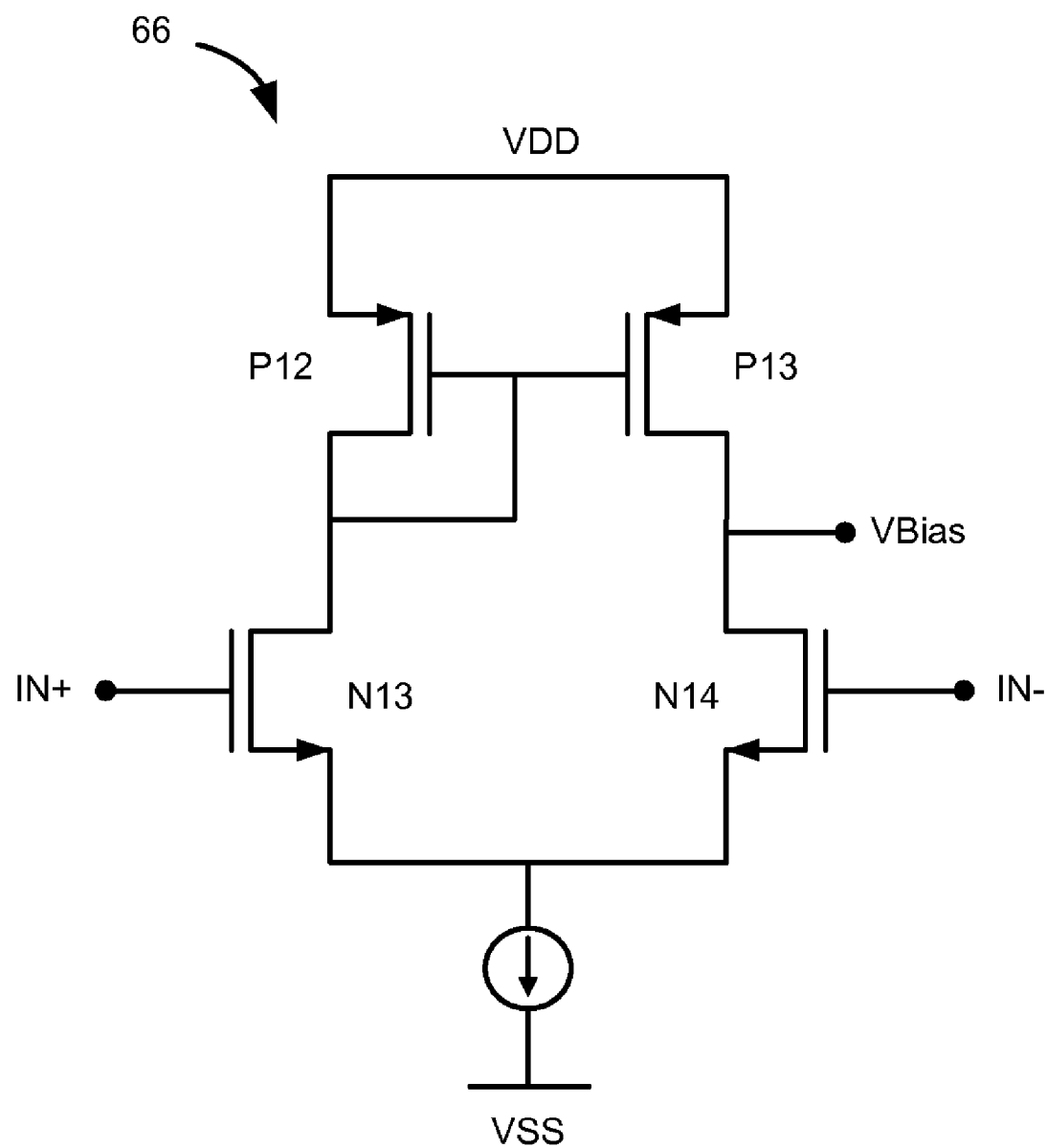
FIG. 15 is a circuit schematic depicting an embodiment of an amplifier that can be used in current source circuits for supplying predetermined currents to the bootstrapped switch circuit.

FIG. 15 depicts an exemplary embodiment of an amplifier circuit 66 that can be used to implement the amplifiers A1, A2 of the current source circuit embodiment 62 of FIG. 8. Other amplifier embodiments are possible.

The operation of circuit embodiments discussed herein is exemplary. The bootstrapped switch circuit 50, as described herein, may be operated differently, e.g., according to different bias regimes, signal composition, etc., and still retain functionality and usefulness. Furthermore, additional embodiments of the bootstrapped switch circuit 50 are possible, which can be the result of variously combining portions of or entire embodiments of the bootstrapped switch circuit 50 described herein. For example, any feature of any of the embodiments of the bootstrapped switch circuit 50 described herein can optionally be used in any of the other embodiments of the bootstrapped switch circuit 50 described herein.

What is claimed is:

1. A bootstrapped switch circuit, comprising:
a switch transistor having a drain configured as an input terminal to receive an input signal; and
a voltage-controlled voltage source configured to provide first and second predetermined constant voltages between a gate and a source of the switch transistor in response to a control signal received at a control terminal,
wherein the first predetermined constant voltage turns on the switch transistor and is produced in response to a first logic state of the control signal by summing a gate-to-source voltage of a transistor of the voltage source with a voltage across a bidirectional circuit element of the voltage source when current flows in a first direction through the bidirectional circuit element, and
wherein the second predetermined constant voltage turns off the switch transistor and is produced in response to a second logic state of the control signal by subtracting from the gate-to-source voltage of the voltage-source transistor the voltage across the bidirectional circuit element when current flows in a second direction through the bidirectional circuit element.

2. The bootstrapped switch circuit of claim 1, wherein the first and second predetermined constant voltages are independent of the magnitude of the input signal, and the voltage-controlled voltage source includes:
the voltage-source transistor having a gate connected to a source of the switch transistor and a source connected to the bidirectional circuit element configured to allow bidirectional current flow therethrough; and
the bidirectional circuit element, having a first terminal connected to the source of the voltage-source transistor and a second terminal connected to the gate of the at least one switch transistor.

3. The bootstrapped switch circuit of claim 1, wherein the voltage-controlled voltage source further comprises:
a first current source providing a first current; and
a second current source providing a second current,
wherein, in response to the first logic state of the control signal, the voltage-controlled voltage source steers a current having a value of the first current minus the second current through the bidirectional circuit element and the voltage-source transistor.

4. The bootstrapped switch circuit of claim 3, wherein, in response to the second logic state of the control signal, the voltage-controlled voltage source steers a current having a value of the second current through the bidirectional circuit element, and a current having a value of the first current minus the second current through the voltage-source transistor.

5. The bootstrapped switch circuit of claim 1, comprising a plurality of switch transistors including:
a first PMOS switch transistor having a drain connected to the input terminal, a source connected to a source of a second PMOS switch transistor, and a back gate connected to the source; and
the second PMOS switch transistor having its source connected to the source of the first PMOS switch transistor, a drain connected to an output terminal to deliver an output signal, and a back gate connected to the source.

6. The bootstrapped switch circuit of claim 1, wherein the switch transistor includes at least one of:
a PMOS switch transistor having a drain connected to the input terminal and a source connected to an output terminal; or
an NMOS switch transistor having a drain connected to the input terminal and a source connected to an output terminal.

7. The bootstrapped switch circuit of claim 1, wherein the voltage-controlled voltage source includes:
a pair of current-steering transistors configured as a differential pair, to receive the control signal at a gate of one of the current-steering transistors, and to steer a first current at connected sources of the current-steering transistors through a selected one of the current-steering transistors in response to the control signal;
the bidirectional circuit element connected to a drain of a first one of the current steering transistors, the bidirectional circuit element capable of current flow in either of two circuit directions; and
the voltage-source transistor, of the same type as the pair of current-steering transistors, having a gate connected to the source of the switch transistor and a source connected to the bidirectional circuit element and a drain of a second one of the current steering transistors.

8. The bootstrapped switch circuit of claim 1, wherein the bidirectional circuit element includes a resistor.

9. A bootstrapped switch circuit, comprising:
first and second switch transistors having gates connected together and sources connected together, the first switch transistor configured to receive an input signal at a drain and the second switch transistor configured to deliver an output signal at a drain;
a voltage controlled voltage source, including:
first and second current-steering transistors configured as a differential pair having sources connected together, the first current-steering transistor configured to receive a control input, the second current-steering transistor configured to receive an inverse of the control input;
a voltage-generating transistor having a gate connected to the connected sources of the first and second switch transistors and a source connected to the drain of the second current-steering transistor;
a bidirectional circuit element having a first terminal connected to a drain of the first current-steering transistor and a second terminal connected to a source of the voltage-generating transistor;
a first current source configured to provide a first current to the connected sources of the first and second current-steering transistors;
a second current source configured to provide a second current to a node connecting the drain of the first current-steering transistor and the first terminal of the bidirectional circuit element.

10. The bootstrapped switch circuit of claim 9, wherein the first current is configured to be greater in value than the second current.

11. The bootstrapped switch circuit of claim 9, wherein in response to receiving a logic low value of the control signal, the second current-steering transistor is turned on and the first current-steering transistor is turned off, the first current flows through the second current-steering transistor, the second current flows through the bidirectional circuit element, and the first current minus the second current flows through the voltage-generating transistor.

12. The bootstrapped switch circuit of claim 11, wherein the gate-to-source voltage delivered to the first and second switch transistors has a magnitude equal to a gate-to-source voltage of the voltage-generating transistor minus a voltage across the bidirectional circuit element.

13. The bootstrapped switch circuit of claim 12, wherein the value of the gate-to-source voltage delivered to the first and second switch transistors is configured by configuring the values of the first and second currents.

14. The bootstrapped switch circuit of claim 9, wherein in response to receiving a logic high value of the control signal, the first current-steering transistor is turned on and the second current-steering transistor is turned off, the first current flows through the first current-steering transistor, and the first current minus the second current flows through the bidirectional circuit element and the voltage-generating transistor.

15. The bootstrapped switch circuit of claim 14, wherein the gate-to-source voltage delivered to the first and second switch transistors has a magnitude equal to a gate-to-source voltage of the voltage-generating transistor plus a voltage across the bidirectional circuit element.

16. The bootstrapped switch circuit of claim 15, wherein the value of the gate-to-source voltage delivered to the first and second switch transistors is configured to be equal to a threshold voltage of the first and second switch transistors plus a predetermined overdrive voltage.

17. The bootstrapped switch circuit of claim 16, wherein the value of the gate-to-source voltage delivered to the first and second switch transistors is configured by configuring the values of the first and second currents.

18. The bootstrapped switch circuit of claim 9, wherein the bidirectional circuit element includes a resistor.

19. The bootstrapped switch circuit of claim 9, wherein at least one of:
the first and second switch transistors include first and second PMOS switch transistors, the first and second current-steering transistors include first and second NMOS current steering transistors, and the voltage-generating transistor includes an NMOS voltage-generating transistor; or
the first and second switch transistors include first and second NMOS switch transistors, the first and second current-steering transistors include first and second PMOS current steering transistors, and the voltage-generating transistor includes a PMOS voltage-generating transistor.

20. A bootstrapped switch circuit, comprising:
a switch transistor having a drain configured as an input terminal to receive an input signal; and a voltage-controlled voltage source configured to provide first and second predetermined constant voltages between a gate and a source of the switch transistor in response to a control signal received at a control terminal, the first and second predetermined constant voltages being independent of the magnitude of the input signal, the voltage-controlled voltage source including:
  a voltage-source transistor having a gate connected to a source of the switch transistor and a source connected to a bidirectional circuit element configured to allow bidirectional current flow therethrough; and
  the bidirectional circuit element, having a first terminal connected to the source of the voltage-source transistor and a second terminal connected to the gate of the switch transistor;
wherein the first predetermined constant voltage turns on the switch transistor and passes the input signal from the drain to the source of the switch transistor, and is produced in response to a first logic state of the control signal by summing a gate-to-source voltage of the voltage-source transistor with a voltage across the bidirectional circuit element, wherein current flows in a first direction through the bidirectional circuit element, and wherein the second predetermined constant voltage turns off the switch transistor and is produced in response to a second logic state of the control signal by subtracting the voltage across the bidirectional circuit element from the gate-to-source voltage of the voltage-source transistor, wherein current flows in a second direction through the bidirectional circuit element.

* * * * *